United States Patent
Chadwick et al.

(10) Patent No.: US 7,237,165 B2
(45) Date of Patent: Jun. 26, 2007

(54) METHOD FOR TESTING EMBEDDED DRAM ARRAYS

(75) Inventors: Laura S. Chadwick, Essex Junction, VT (US); William R. Corbin, Underhill, VT (US); Jeffrey H. Dreibelbis, Williston, VT (US); Erik A. Nelson, Waterbury, VT (US); Thomas E. Obremski, South Burlington, VT (US); Toshiharu Saitoh, South Burlington, VT (US); Donald L. Wheater, Hinesburg, VT (US)

(73) Assignee: International Business Machines Corporation, Armonk, NY (US)

(*) Notice: Subject to any disclaimer, the term of this patent is extended or adjusted under 35 U.S.C. 154(b) by 177 days.

(21) Appl. No.: 10/994,496

(22) Filed: Nov. 22, 2004

(65) Prior Publication Data

US 2005/0088888 A1    Apr. 28, 2005

Related U.S. Application Data

(62) Division of application No. 10/065,694, filed on Nov. 11, 2002, now Pat. No. 7,073,100.

(51) Int. Cl.
*G01R 31/28*   (2006.01)
*G11C 29/00*   (2006.01)

(52) U.S. Cl. ...................... 714/733; 714/718
(58) Field of Classification Search ............... 714/718, 714/710, 733
See application file for complete search history.

(56) References Cited

U.S. PATENT DOCUMENTS

| | | | |
|---|---|---|---|
| 5,471,482 A | 11/1995 | Byers et al. | |
| 5,689,466 A | 11/1997 | Qureshi | |
| 5,761,213 A | 6/1998 | Adams et al. | |
| 5,961,653 A | 10/1999 | Kalter et al. | |
| 6,034,900 A | 3/2000 | Shirley et al. | |
| 6,064,620 A | 5/2000 | Mobley | |
| 6,141,779 A * | 10/2000 | Hill et al. | 714/710 |
| 6,182,257 B1 | 1/2001 | Gillingham | |
| 6,252,806 B1 | 6/2001 | Ellis et al. | |
| 6,560,740 B1 * | 5/2003 | Zuraski et al. | 714/733 |
| 6,668,347 B1 * | 12/2003 | Babella et al. | 714/733 |

FOREIGN PATENT DOCUMENTS

EP    0523973 A2    1/1993

* cited by examiner

*Primary Examiner*—James C Kerveros
(74) *Attorney, Agent, or Firm*—Schmeiser, Olsen & Watts; Anthony J. Canale

(57) ABSTRACT

A system for testing a DRAM includes DRAM blocks, the system further includes a processor based built-in self test system for generating a test data pattern, for each DRAM block, performing a write of the test data pattern into the DRAM block, performing a pause for a predetermined period of time, and performing a read of a resulting data pattern from the DRAM block. For each DRAM block, the performing the write of the test pattern into the DRAM block is performed before the performing the pause for the predetermined period of time, and the performing the read of the resulting data pattern from the DRAM block is performed after the performing the pause for the predetermined period of time, and at least a portion of the pause for the predetermined period of time of two or more the DRAM blocks overlap in time.

18 Claims, 8 Drawing Sheets

METHOD FOR TESTING EMBEDDED DRAM ARRAYS

This application is a division of and claims priority of nonprovisional U.S. patent application Ser. No. 10/065,694 filed Nov. 11, 2002 and now U.S. Pat. No. 7,073,100.

BACKGROUND OF THE INVENTION

1. Field of the Invention

The present Invention relates to the field of integrated circuit chips; more specifically, it relates to a method of testing integrated circuit chips having Dynamic Random Access Memory (DRAM) embedded in logic using processor based Built-In-Self-Test.

2. Background of the Invention

Advanced integrated chips having a logical function such as gate arrays, microprocessors, Digital Signal Processors (DSP) and Application Specific Integrated Circuits (ASIC) require DRAMs embedded in the logic to function. BIST was originally developed for testing logic circuits and has been extended to testing embedded DRAMs as well.

Typical embedded DRAMs are comprised of multiple blocks of memory cell arrays. Testing of embedded DRAMs requires special test patterns designed to identify specific types of failures. One test of particular importance for embedded DRAMs cells using capacitive storage node devices is the retention time test. Retention time is the time a memory cell will hold its state before charge leaking off the storage node renders determination of the state of the cell uncertain.

Retention time testing requires reading a pattern into a block, pausing the test for a fixed amount of time, and reading out a pattern and comparing the readout pattern to an expected pattern. This sequence of write, pause, read and compare is repeated sequentially for each block of memory cell arrays in the embedded DRAM. The pause time is typically 1000 times longer than the write step or the read and compare step.

As the size of embedded DRAMs increase and especially the number of blocks of memory cell arrays per DRAMs increase, test times also increase. Test times have become a significant cost adder to gate arrays, microprocessors, DSPs and ASIC because of the added test equipment required. Increased test times have also had an adverse effect on productivity.

Therefore, there is a need in the industry for a method to reduce the amount of time to test embedded DRAM in such integrated circuit chips as gate arrays, microprocessors, DSPs and ASICs.

SUMMARY OF THE INVENTION

A first aspect of the present invention is a method of testing a DRAM, the DRAM comprised of a multiplicity of DRAM blocks, comprising: in a processor based built-in self test system, generating a test data pattern; for each DRAM block, performing a write of the test data pattern into the DRAM block, performing a pause for a predetermined period of time, and performing a read of a resulting data pattern from the DRAM block; wherein for each DRAM block, the performing the write of the test pattern into the DRAM block is performed before the performing the pause for the predetermined period of time, and the performing the read of the resulting data pattern from the DRAM block is performed after the performing the pause for the predetermined period of time; and wherein at least a portion of the pause for the predetermined period of time of two or more the DRAM blocks overlap in time.

A second aspect of the present invention is a processor based built-in self test system for testing an embedded DRAM, the embedded DRAM including a multiplicity of DRAM blocks, each DRAM block comprising a multiplicity of wordlines and bitlines, comprising: means for generating a test data pattern; means for writing the test data pattern into each DRAM block simultaneously; means for reading out a resultant data pattern from each the DRAM block after a predetermined period of time has elapsed from the writing of the test data into each the DRAM block, the reading out occurring sequentially from a first DRAM block to a last DRAM block of the multiplicity of the DRAM blocks, the reading of any previous DRAM block of the multiplicity of DRAM blocks being completed before the reading of a subsequent DRAM block of the multiplicity of DRAM blocks; means for storing scan out data for each the DRAM block on a register, the scan out data comprising the resultant data pattern or information based on the resultant data pattern of each the DRAM block; and means for scanning out the scan out data, the scanning out of any previous scan out data for a previous DRAM block of the multiplicity of DRAM blocks is completed before the scanning in of scan out data of a subsequent DRAM block of the multiplicity of DRAM blocks.

A third aspect of the present invention is a processor based built-in self test system for testing an embedded DRAM, the embedded DRAM including a multiplicity of DRAM blocks, each DRAM block comprising a multiplicity of wordlines and bitlines, comprising: means for generating a test data pattern; means for writing the test data pattern into each DRAM block sequentially from a first DRAM block to a last DRAM block of the multiplicity of DRAM blocks, the writing of a previous DRAM block being completed before the writing of a subsequent DRAM block of the multiplicity of DRAM blocks; means for reading out a resultant data pattern from each the DRAM block after a predetermined period of time has elapsed from the writing of the test data into each the DRAM block, the reading out occurring sequentially from a first DRAM block to a last DRAM block of the multiplicity of the DRAM blocks, the reading of any previous DRAM block of the multiplicity of DRAM blocks being completed before the reading of a subsequent DRAM block of the multiplicity of DRAM blocks; means for storing scan out data for each the DRAM block on a different store register of a multiplicity of store registers, the scan out data comprising the resultant data pattern or information based on the resultant data pattern of each the DRAM block, the storing of previous scan out data for a previous DRAM block of the multiplicity of DRAM blocks being completed before the storing of scan out data for a subsequent DRAM block of the multiplicity of the DRAM blocks.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A DRAM is composed of an array of storage cell arranged in rows and columns. The DRAM is addressed through wordlines arranged in the row direction and data is written to the DRAM though bitlines arranged in the column direction. To access a DRAM for read or write, the proper wordlines need to be activated and the proper bitlines selected (often called column select). Groups of wordlines are combined to form blocks of memory. Generally, each block of memory is enabled to receive address information separately. DRAMs include redundant wordlines and bitlines that may be "substituted" for original wordlines and bitlines that contain failing cells. Substitution is performed by deleting fuses to redirect address information.

Figure 1:
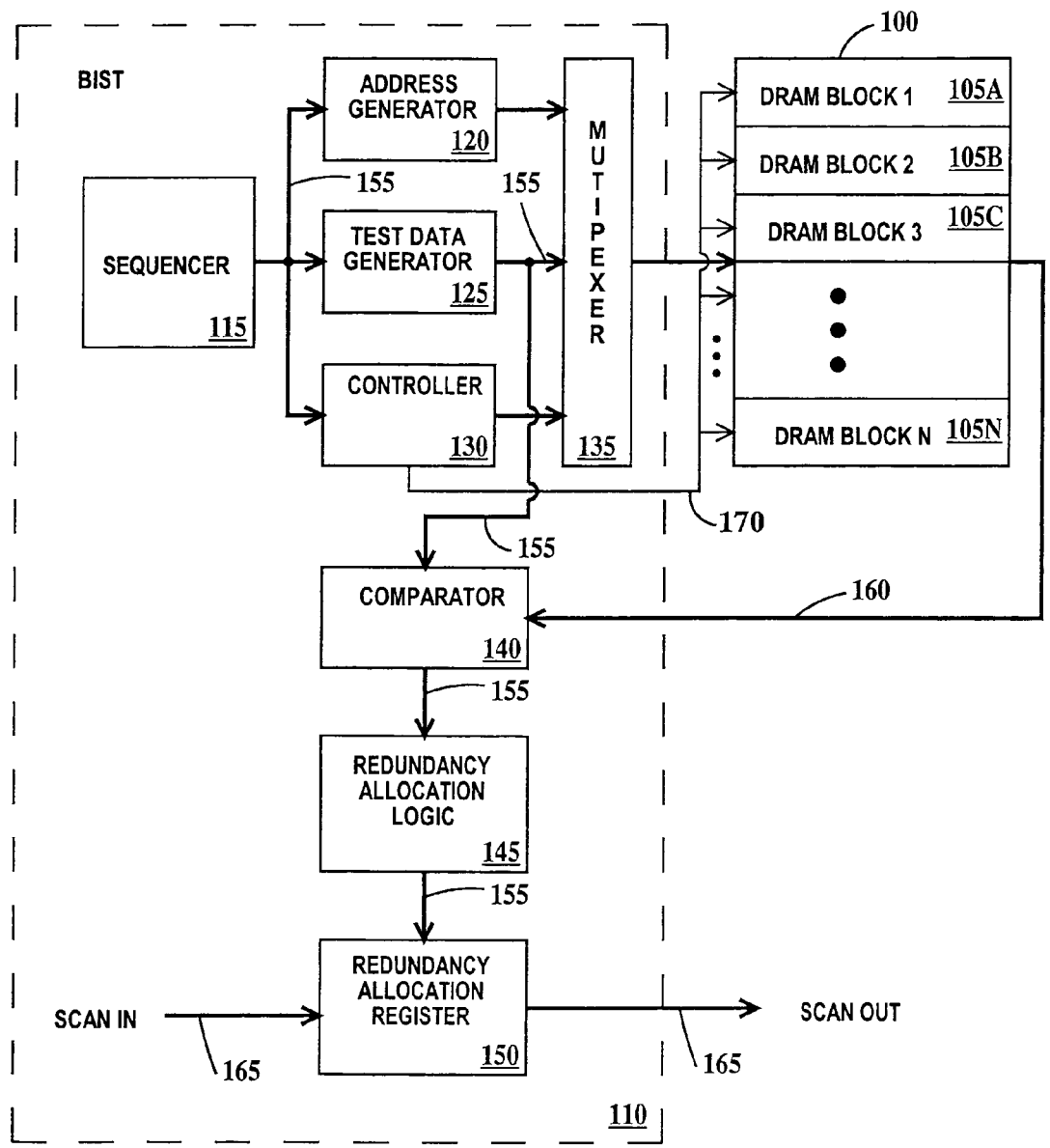
FIG. 1 is a schematic block diagram of an embedded DRAM memory and test system according to a first embodiment of the present invention.

FIG. 1 is a schematic block diagram of an embedded DRAM memory and test system according to a first embodiment of the present invention. In FIG. 1, embedded DRAM 100 comprises a multiplicity of DRAM blocks 105A, 105B, 105C through 105N. DRAM block 105A being the first DRAM block and DRAM block 105N being the last block of embedded DRAM 100 in terms of address sequence. While FIG. 1 illustrates DRAM blocks 105A through 105N arranged in a stack of one above another, the physical layout of the DRAM blocks may be different, for example, the DRAM blocks may be arranged into two adjacent stacks. Embedded DRAM 100 is coupled to a built in self-test (BIST) system 110. A BIST based tester for an embedded DRAM is described in U.S. Pat. No. 5,961,653 which is hereby incorporated by reference. Test system 110 is comprised of a sequencer 115, an address generator 120, a test data generator 125, a controller 130, a multiplexer 135, a comparator 140, redundancy allocation logic 145 and a redundancy allocation register 150 all coupled to a test buss 155. Alternatively, register 135 may be incorporated in DRAM 100.

Sequencer 115 contains test instructions that the sequencer assembles into test patterns under the control of an internal or external processor or micro-processor. Address generator 120 includes a column address counter (bitlines), a row address counter (wordlines) and a DRAM block address counter, each driven from test buss 155, for counting test cycles. Test data generator 125 includes a data-in generator for writing the physical 0/1 s of the test pattern into DRAM 100 and a data-out (expected values) generator of physical 0/1 s used by comparator 140 during read cycles. Controller 130, under direction of test buss 155, gates control signals to DRAM 100 appropriate to the particular test pattern and test cycle being applied. Comparator 140 compares the expected values provided by data generator 125 with observed values on output bus 160. Redundancy allocation logic 145 determines which array elements of DRAM 100 have failed based on the compare performed by comparator 140. The redundancy allocation logic determines specific redundant word lines or bitlines to replace the wordlines and bitlines having failed cells. The redundancy allocation register 150 stores the results of the redundancy allocation logic and allows scanning the results out on scan buss 165 to die pads or module pins.

Controller 130 also has the function of sending a block enable signal 170 to all DRAM blocks 105A through 105N which allows writing of test data from test data generator 125 to all DRAM blocks 105A through 105N simultaneously (in parallel).

For retention time testing, after data is written to all DRAM blocks 105A through 105N simultaneously, testing is paused for a predetermined amount of time and then the data in each DRAM block 105A through 105N is read out sequentially. In other words, after the expiration of the predetermined pause time, data in BLOCK 105A is read out into comparator 140, redundancy allocation logic 145 determines which replacement wordlines/bitlines (if any) to use and that information is transferred to redundancy allocation register 150 where it is scanned out. Next DRAM block 105B is read out and the process continues until DRAM block 105N has been read out, and the information on replacement wordlines/bitlines (if any) is scanned out. This sequence of events is illustrated in FIG. 2 and described infra.

Figure 2:
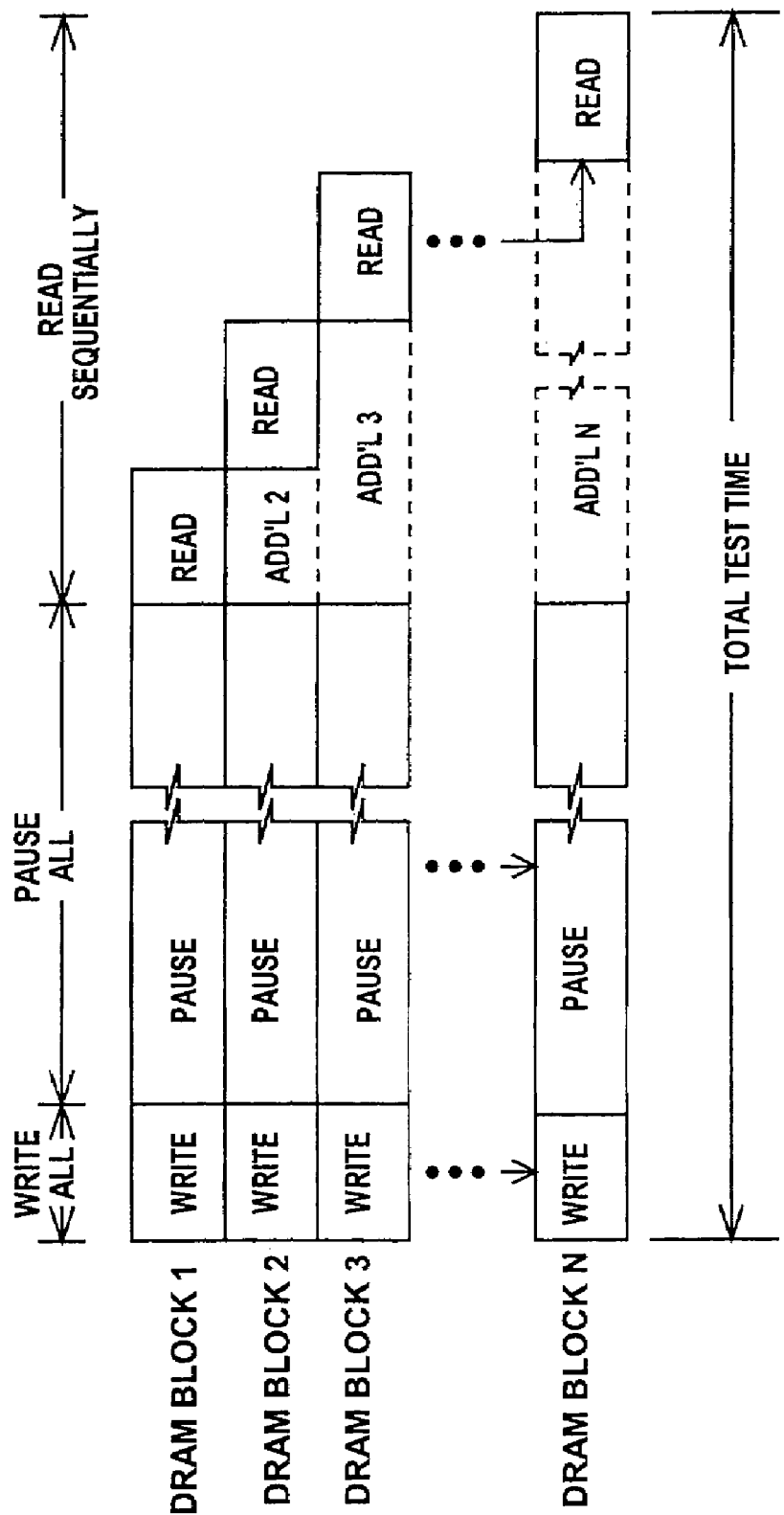
FIG. 2 is a diagram illustrating the write-pause-read sequence for testing an embedded DRAM according to the first embodiment of the present invention.

FIG. 2 is a diagram illustrating the write-pause-read sequence for testing an embedded DRAM according to the first embodiment of the present invention. In FIG. 2, each row illustrates the read, pause and read sequence for a single DRAM block. The vertical direction is test time. As will be noted, DRAM blocks are all written simultaneously and all paused simultaneously for the same predetermined pause time. However since read is performed sequentially, the read of a subsequent DRAM block not started until the completion of the read of the previous DRAM block, the total pause time for each DRAM block after the first DRAM block increases by the time required to read out all the previous DRAM blocks. However, because the pause time can be in the order of, for example, 1000 times the write and read time, this additional pause time is negligible.

Taking the example of a DRAM array comprised of eight DRAM blocks, where the read and write time is 80 microseconds and the pause time 80,000 microseconds, the total test time is 80+80,000+(8×80)=80,720 microseconds (80.72 milliseconds). If the same DRAM were tested conventionally, the total test time would be 8×(80+80,000+80)=641,280 microseconds (641.28 milliseconds). Thus, the first embodiment of the present invention takes only about 12.6% of the time of conventional testing or is about eight times faster. For a 16 block DRAM, the invention is about 16 times faster. The longest additional test pause for the eight-DRAM block DRAM array, of the present example, is 7×80 or 560 microseconds. Thus, the longest additional pause time is only 0.675% longer than the predetermined pause time, which, as stated supra, is negligible.

Figure 3:
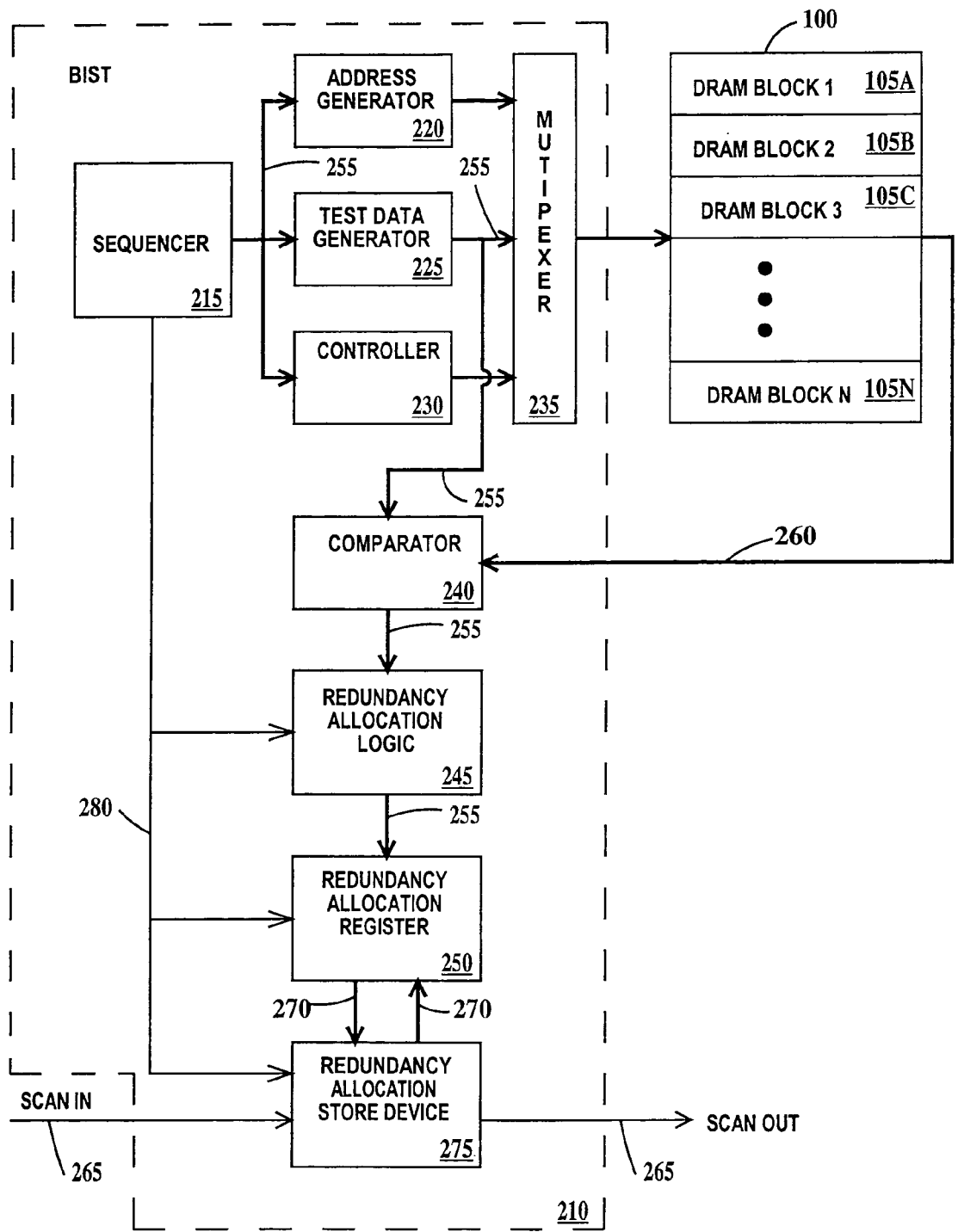
FIG. 3 is a schematic block diagram of an embedded DRAM memory and test system according to a second embodiment of the present invention.

FIG. 3 is a schematic block diagram of an embedded DRAM memory and test system according to a second embodiment of the present invention. In FIG. 3, embedded DRAM 100 is coupled to a built in self-test (BIST) system 210. Test system 210 is comprised of a sequencer 215, an address generator 220, a test data generator 225, a controller 230, a multiplexer 235, a comparator 240, redundancy allocation logic 245 and a redundancy allocation register 250 all coupled to a test buss 255. Alternatively, register 235 may be incorporated in DRAM 100. DRAM 100 is also coupled to comparator 240 by an output bus 260.

Sequencer 215, address generator 220, test data generator 225, controller 230, multiplexer 235, comparator 240, redundancy allocation logic 245, redundancy allocation register 250, test buss 255, output bus 260 and scan buss 265 are similar to and perform similar function as sequencer 115, address generator 120, test data generator 125, controller 130, multiplexer 135, comparator 140, redundancy allocation logic 145, redundancy allocation register 150, test buss 155, output bus 160 and scan buss 165 of FIG. 1, respectively with the following differences: (1) Controller 230 does not send a block enable signal to all DRAM blocks 105A through 105N. (2) Redundancy allocation register 250 does not have direct scan out capability.

Figure 4:
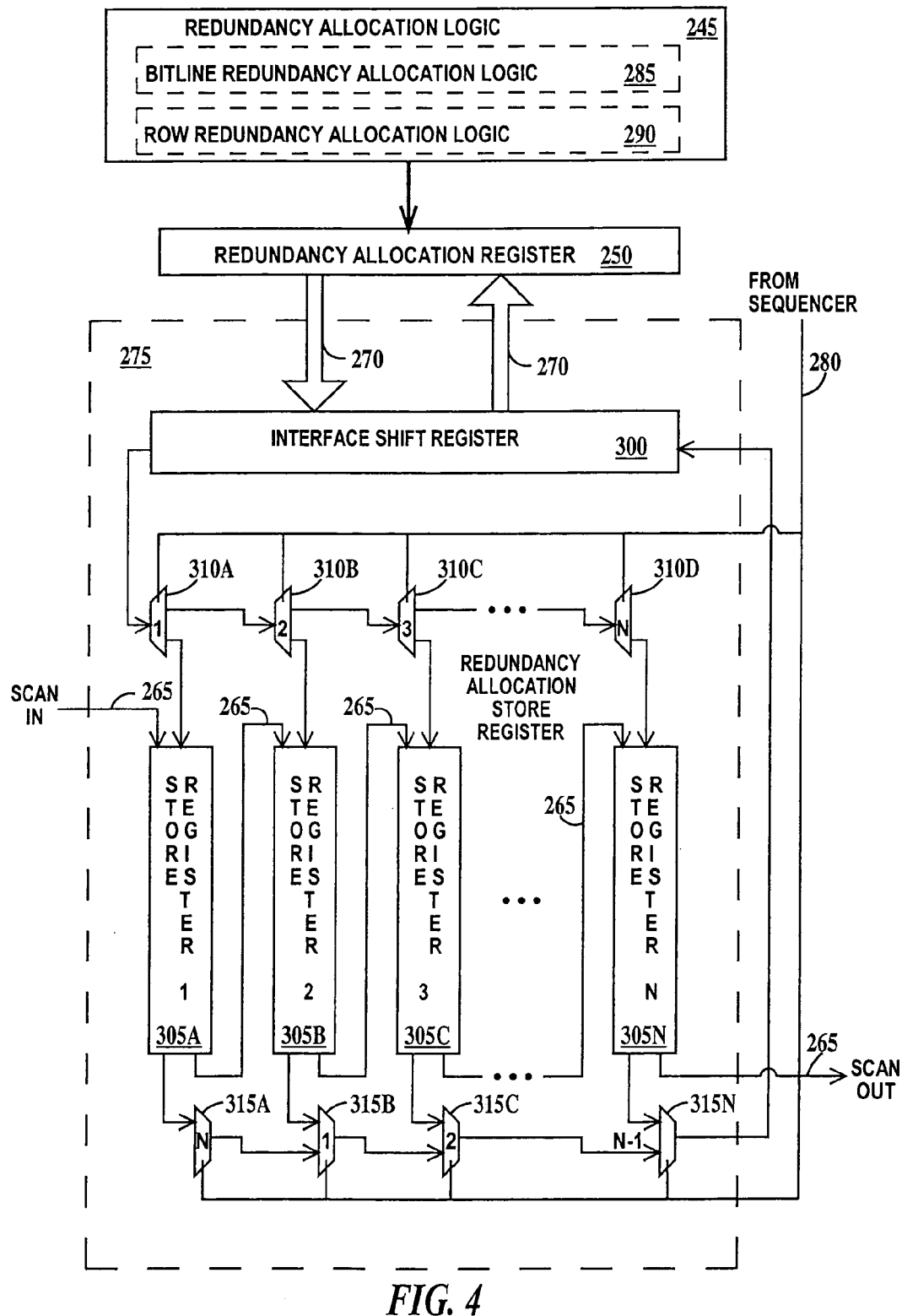
FIG. 4 is a schematic block diagram of the redundancy allocation store device store according of FIG. 3.

Test system 210 further includes a redundancy allocation store device 275 coupled to redundancy allocation register 250 by transfer bus 270. Redundancy allocation store register 275 stores the replacement information generated by redundancy allocation register 250. Redundancy allocation store register 275 is illustrated in FIG. 4 and described infra.

Figure 5:
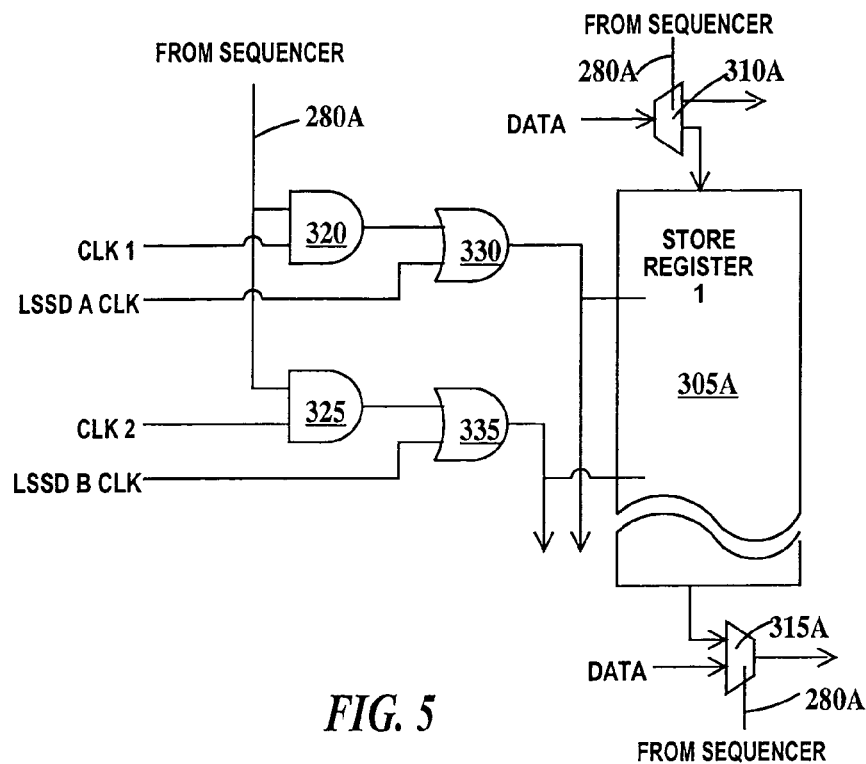
FIG. 5 is a schematic block diagram illustrating the clocking signals for the redundancy allocation store device store according of FIG. 4.
Figure 6:
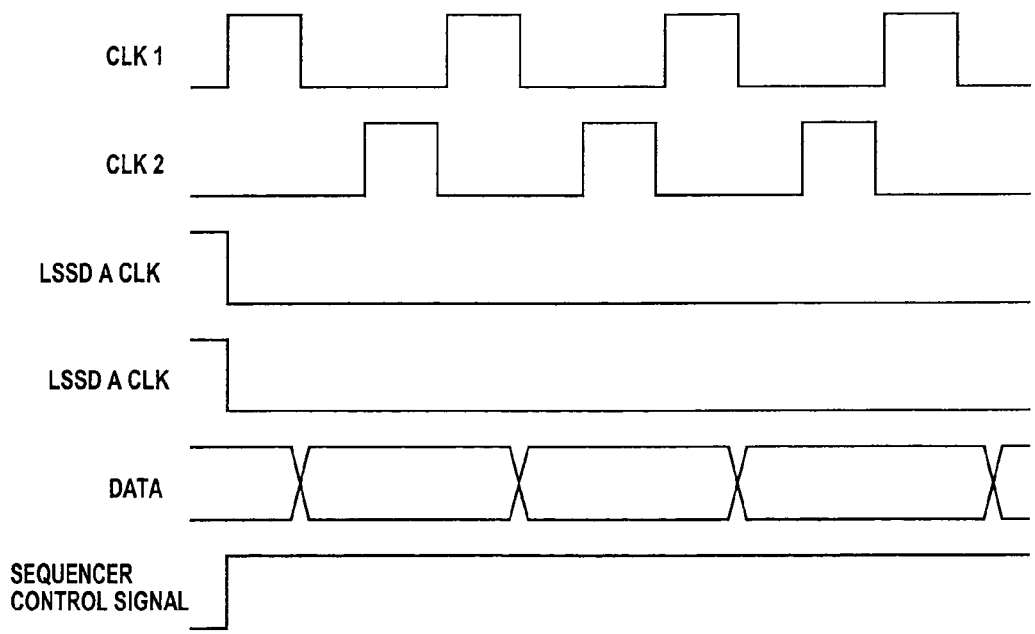
FIG. 6 is a timing diagram of the clocking signals of the circuit of FIG. 5.

Sequencer 215, additionally generates synchronization signals 280 used by redundancy allocation logic 245, redundancy allocation register 250 and redundancy allocation store device 275 as illustrated in FIGS. 5 and 6 and described infra.

For retention time testing, after data is written to each of DRAM blocks 105A through 105N sequentially, testing is paused for each DRAM block for a predetermined amount of time and then the data in each DRAM block 105A through 105N is read out sequentially. However, as soon as a previous DRAM block is written, the next DRAM block is written and as soon as the pause time on any DRAM block has expired, the data on that DRAM block is read. Therefore, pause times of each DRAM block overlap. This sequence of events is controlled by sequencer 270 through test buss 255 and synchronization signals 280. In other words, as soon as data is written to DRAM block 105A and its pause commenced, data is next written into DRAM block 105B and its paused commenced and so on until DRAM block 105N is written. After the expiration of the predetermined pause time for DRAM block 105A, data in DRAM block 105A is read out into comparator 140. After the expiration of the predetermined pause time for DRAM block 105B, data in DRAM block 105B is read into comparator 140. This sequence continues until DRAM block 105N is read into comparator 140. This sequence of events is illustrated in FIG. 8 and described infra.

Because redundancy allocation register 250 is only large enough to hold the redundancy allocation data for a single DRAM block, the data for each block is transferred to redundancy allocation store device 275 as subsequent DRAM blocks are read out. When testing is complete, the redundancy allocation information for all DRAM block 105A through 105N is scanned out of redundancy allocation register 275.

Figure 8:
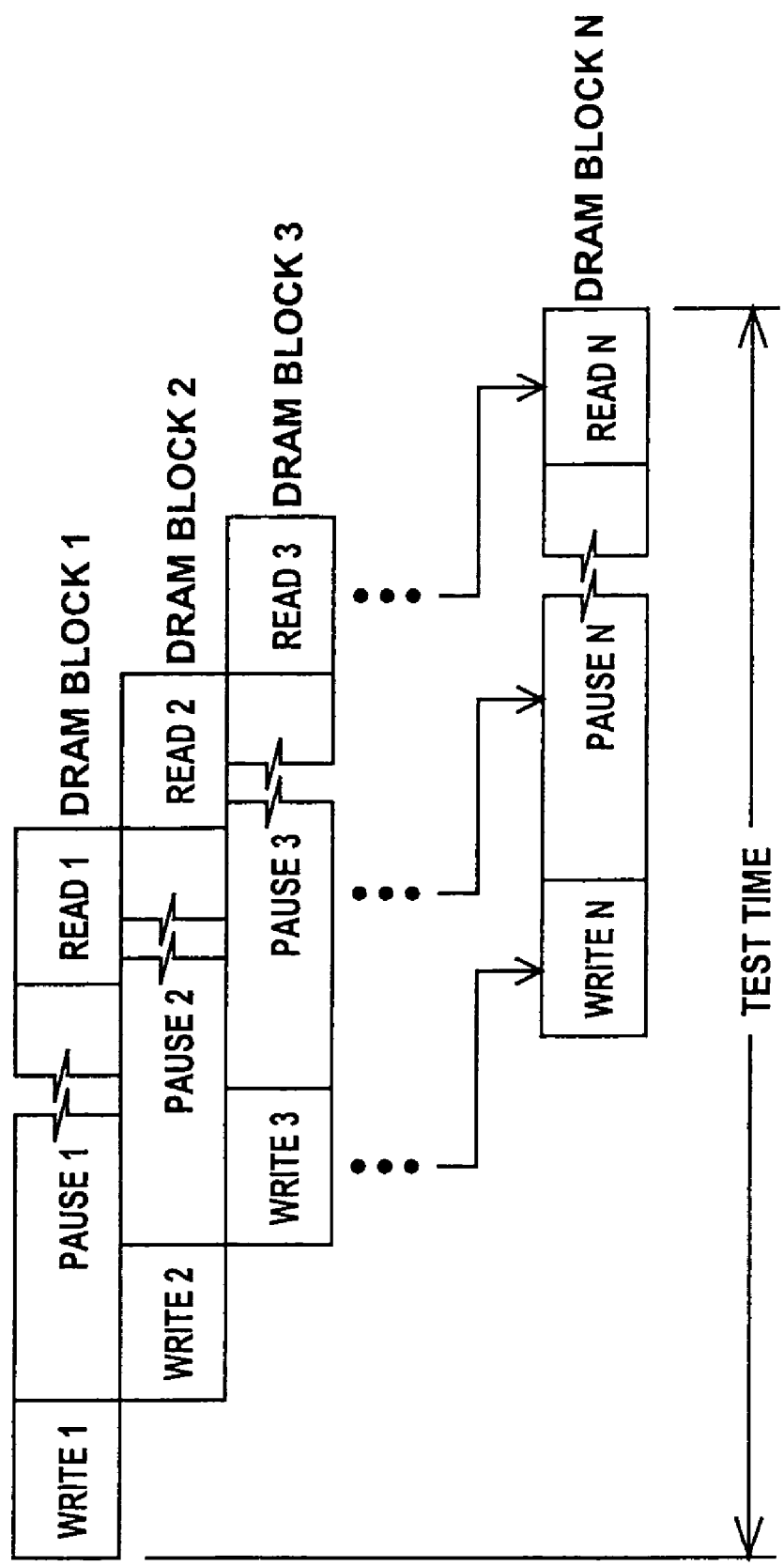
FIG. 8 is a diagram illustrating the write-pause-read sequence for testing an embedded DRAM according the second embodiment of the present invention.

Before discussing the details of redundancy allocation register 275 and control signals 280, it will be useful to examine the write-pause-read sequence in more detail and turn to FIG. 8. FIG. 8 is a diagram illustrating the write-pause-read sequence for testing an embedded DRAM according to the second embodiment of the present invention. In FIG. 8, each row illustrates the read, pause and read sequence for a single DRAM block. The vertical direction is test time. As will be noted, DRAM blocks are all written sequentially and all paused immediately after writing for the same predetermined pause time. The read of each individual DRAM block is started immediately after the expiration of the pause time.

Taking the example of a DRAM array comprised of eight DRAM blocks, where the read and write time is 80 microseconds and the pause time 80,000 microseconds, the total test time is (8×80)+80,000+80=80,720 microseconds (80.72 milliseconds) the same as for the example of the first embodiment of the present invention (see FIG. 2). Because of the overlap of pause times, it is possible to "run out" of pause time if the number of blocks is extremely large. In the present example, that would occur when the number of DRAM blocks exceeded 999. In this event, the test time would increment by 80 microseconds for each additional DRAM block over 999.

FIG. 4 is a schematic block diagram of the redundancy allocation store device store according of FIG. 3. In FIG. 4, redundancy allocation register 245, containing row redundancy allocation logic 285 and bitline redundancy allocation logic 290 is coupled to redundancy allocation store device 275 by test buss 255.

Figure 7:
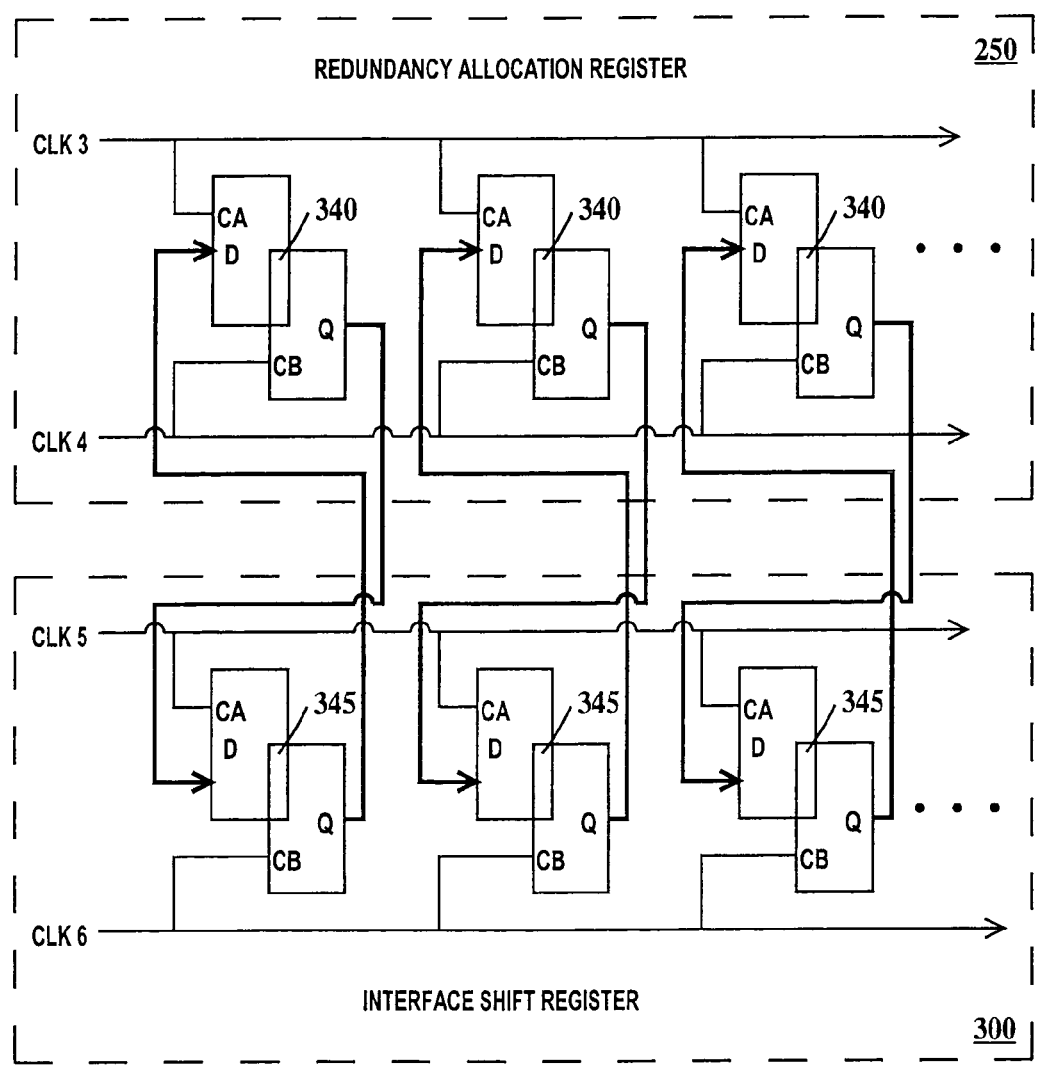
FIG. 7 is a schematic diagram of the interconnection between the redundancy allocation register and the serial interface register of FIG. 4.

Redundancy allocation store register includes an interface register 300 coupled to a multiplicity of store registers 305A, 305B, 305C through 305N. For every DRAM block, 105A through 105N (see FIG. 3) there is a corresponding store register 305A through 305N. After every read of a DRAM block, the redundancy allocation information for that particular DRAM block which was written to redundancy allocation register, as described supra, is swapped with the current contents of interface shift register 300. This operation is illustrated in FIG. 7 and described infra.

After the swap of contents, interface register 300 holds the allocation information for the last read (last test complete) DRAM block. The contents of interface shift register 300 are then written to one of the store registers 305A through 305N. The sequence of reading and writing is gated by input multiplexers 310A, 310B, 310C through 310N and by output multiplexers 315A, 315B, 315C through 315N by synchronization signals 280. For every store register, 305A through 305N there is a corresponding input multiplexer 310A through 310N and a corresponding output multiplexer 315A through 315N. Synchronization signals 280 are also applied to clock lines with each store register 305A through 305N as illustrated in FIG. 5 and described infra.

The operation of redundancy allocation store device 275 occurs in cycles. The first cycle commences when the allocation information in redundancy allocation register 250, which contains redundancy allocation information for DRAM block 105A (see FIG. 3) is swapped with the contents interface shift register 300, which is "empty" or contains data from a previous test. The contents of store register 305N are then shifted into interface shift register 300 while the contents of the interface shift register are shifted into store register 305A.

The second cycle commences when the allocation information in redundancy allocation register 250, which now contains redundancy allocation information for DRAM block 105B (see FIG. 3) is swapped with the contents interface shift register 300. The contents of store register 305A are then shifted into interface shift register 300 while the contents of the interface shift register are shifted into store register 305B.

The third cycle commences when the allocation information in redundancy allocation register 250, which now contains redundancy allocation information for DRAM block 105C (see FIG. 3) is swapped with the contents interface shift register 300. The contents of store register 305B are then shifted into interface shift register 300 while the contents of the interface shift register are shifted into store register 305C.

The fourth through next-to-last cycles are similar to the previous cycles.

The last cycle commences when the allocation information in redundancy allocation register 250, which now contains redundancy allocation information for DRAM block 105N (see FIG. 3) is swapped with the contents interface shift register 300. The contents of next-to-last store register 305N-1 (not shown) are then shifted into interface shift register 300 while the contents of the interface shift register are shifted into store register 305N. After the last cycle, the contents of all store registers 305A through 305N are scanned out sequentially on scan buss 265.

FIG. 5 is a schematic block diagram illustrating the clocking signals for the redundancy allocation store device store according of FIG. 4. Only store register 305A is illustrated. In FIG. 5, a specific control signal 280A (corresponding to store register 305A is applied to input multiplexer 310A, output multiplexer and first inputs of AND gates 320 and 335. For store registers 305B through 305N, specific control signals 280N through 280N would be applied. A first clock signal CLK1 is applied to a second input of AND gate 320 and a second clock signal CLK2 is applied to a second input of AND gate 325. The output of AND gate 320 is coupled to a first input of AND gate 330 and an a level sensitive scan design (LSSD) A CLK signal is applied to a second input of AND gate 330. The output of AND gate 325 is coupled to a first input of an AND gate 335 and an a LSSD B CLK signal is applied to a second input of an AND gate 335. CLK 1, CLK 2, LSSD A CLK and LSSD B CLK are global signals provided to all store registers. LSSD A CLK and LSSD B CLK are used for scan in and scan out operations as well. The output of AND gates 330 and 335 are coupled to store register 305A to control serial shifting of bits with the store register.

FIG. 6 is a timing diagram of the clocking signals of the circuit of FIG. 5. As can be seen from FIG. 6, CLK 1 is on only when CLK 2 is off and vice versa. Nether CLK1 or CLK 2 is active when LSSD A CLK or LSSD B Clock is high or control signal 280A is low.

FIG. 7 is a schematic diagram of the interconnection between the redundancy allocation register and the serial interface register of FIG. 4. In FIG. 4, redundancy allocation register 250 is comprised of a multiplicity of latches 340, each latch 340 having a two clock inputs CA and CB. Interface shift register 300 is comprised of a multiplicity of latches 345, each latch 345 having a two clock inputs CA and CB. The CA clock, times data input into a first half (upper rectangle) of latches 340 and 345 and the CB clock times transfer data from the first half of each latch to a second half of each latch (lower rectangle) and to output Q. There is the same number of latches 340 as there are latches 345.

All the CA inputs of latches 340 are coupled to a third clock signal CLK 3. All the CB inputs of latches 340 are coupled to a fourth clock signal CLK 4. All the CA inputs of latches 345 are coupled to a fifth clock signal CLK 5. All the CB inputs of latches 345 are coupled to a sixth clock signal CLK 6. The output Q of each latch 340 is coupled to a corresponding input D of each latch 345. The output Q of each latch 345 is coupled to a corresponding input D of each latch 340. The data lines used to write to redundancy allocation register 250 and interface shift register 300 when they are in shift register mode have not been illustrated in FIG. 7 to simplify the drawing.

When data is swapped between redundancy allocation register 250 and interface shift register 300, data in all latches is transferred simultaneously between corresponding latches. The transfer is performed in the following sequence: (1) Redundancy allocation information is transferred into latches 340 (CLK3, CLK4, CLK5, CLK 6 are all low). (2) When CLK 5 is high data is transferred from the first halves of latches 345 to the second halves of latches 345. (3) When CLK 3 is high is high data is transferred from the second halves of latches 345 to the first halves of latches 340. (4) When CLK 4 and CLK 6 are high data is transferred from first halves of second of latches 340 to the first halves of latches 340 and to transfer data from second halves of latches 345 to the first halves of latches 340. (6) Redundancy allocation register 250 is conditioned for receiving redundancy allocation data for the next DRAM block to be tested (CLK3, CLK4, CLK5, CLK 6 are all low).

Figure 9:
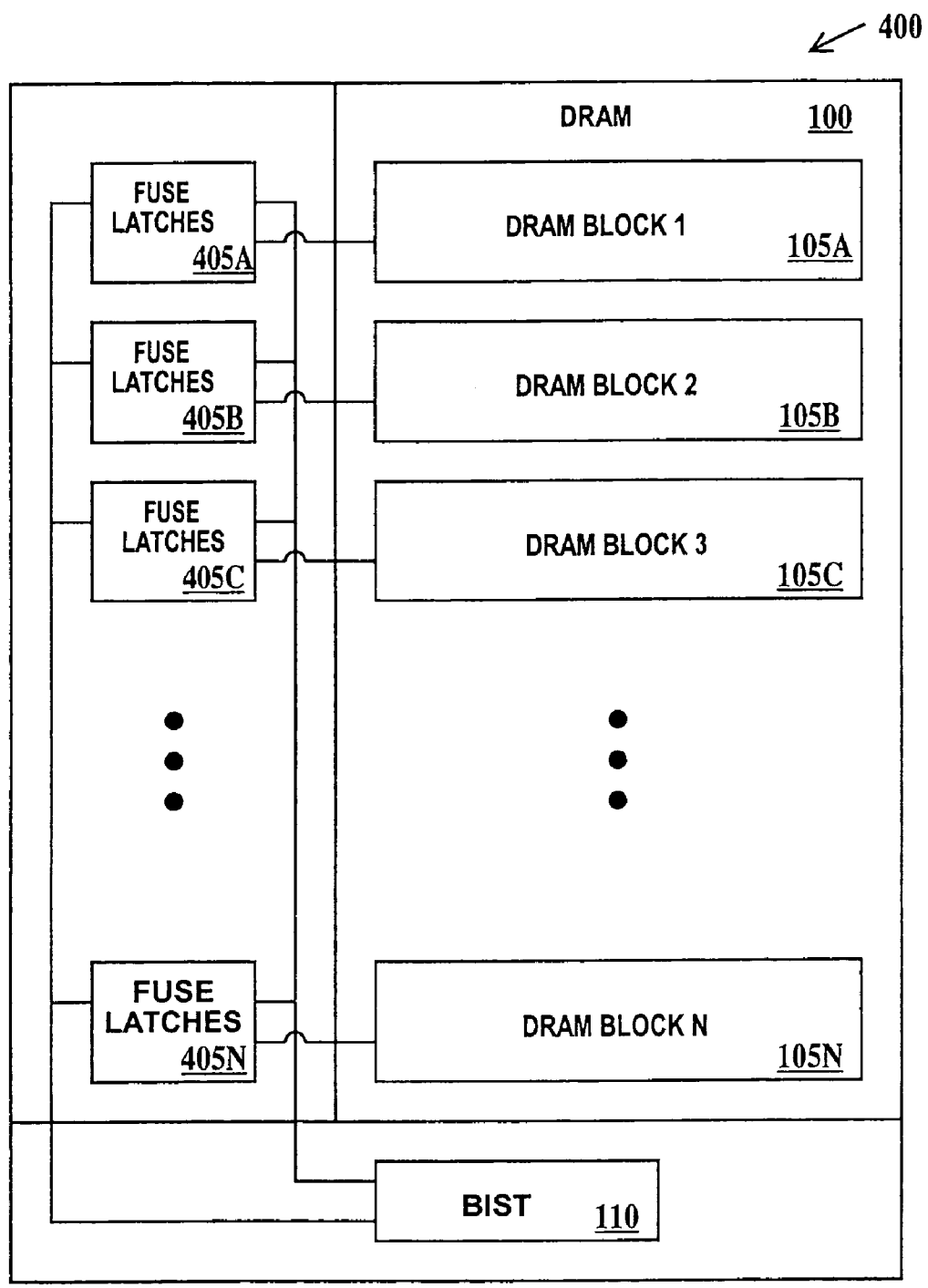
FIG. 9 is a schematic diagram of a physical implementation of the second embodiment of the present invention.

FIG. 9 is a schematic diagram of a physical implementation of the second embodiment of the present invention. In FIG. 9, embedded DRAM macro 400 includes DRAM 100, BIST 110 and a multiplicity of fuse latches 405A, 405B, 405C through 405N. There is one fuse latch 405A through 405N for every DRAM block 105A through 105N in DRAM 100. Each DRAM block 105A through 105N includes a fuse bank and a redundancy array of wordlines and bitlines (not shown). In one implementation of the present invention, store registers 305A through 305N (see FIG. 4) are fuse latches 405A through 405N. During testing, fuse latches 405A through 405N are used to store the redundancy allocation information that, after scanned out, will be scanned back in order to delete the fuse banks to replace failing wordlines and bitlines with wordlines and bitlines selected from the redundancy array. This implementation saves eDRAM macro 400 real estate and the store registers automatically scale as the eDRAM macro is scaled saving design time.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the invention has been illustrated using BIST, but is readily adaptable to conventional test methodologies. Therefore, it is intended that the following claims cover all such modifications and changes as fall within the true spirit and scope of the invention.

What is claimed is:

1. A processor based built-in self test system contained in an integrated circuit chip having an embedded DRAM, said embedded DRAM including a multiplicity of DRAM blocks, said test system comprising:

means for generating a test data pattern;

means for writing said test data pattern into each DRAM block simultaneously;

means for reading out sequentially from a first DRAM block to a last DRAM block of said multiplicity of DRAM blocks a resultant data pattern from each said DRAM block of said multiplicity of DRAM blocks after a predetermined period of time has elapsed from said writing of said test data into each said DRAM block of said multiplicity of DRAM blocks, said means for reading further including means for completing the reading of any previous DRAM block of said multiplicity of DRAM blocks before the reading of a subsequent DRAM block of said multiplicity of DRAM blocks;

means for storing scan out data for each said DRAM block, said scan out data comprising said resultant data pattern or information based on said resultant data pattern of each said DRAM block; and means for scanning out said scan out data, said means for scanning including means for completing scanning out of any previous scan out data for a previous DRAM block of said multiplicity of DRAM blocks before scanning in of scan out data for a subsequent DRAM block of said multiplicity of DRAM blocks.

2. The test system of claim 1, further including:

means for comparing said resultant data pattern with said test data pattern; and means for creating redundancy allocation information based on the comparison between said resultant data pattern and said test data pattern.

3. The test system of claim 2, wherein said scan out data comprises said redundancy allocation information.

4. The test system of claim 1, wherein said means for storing scan out data comprises a register.

5. The test system of claim 1, further including:

means for comparing said resultant data pattern with said test data pattern and for creating redundancy allocation information based on the comparison between said resultant data pattern and said test data pattern and storing; and a redundancy allocation register for storing said redundancy allocation information.

6. The test system of claim 5, further including:

means for scanning out said redundancy allocation information from said redundancy allocation register.

7. The test system of claim 5, wherein said means for storing scan out data comprises a register and further including means for scanning in fuse delete information based on said redundancy allocation information into said store register.

8. A processor based built-in self test system contained in an integrated circuit chip having an embedded DRAM, said embedded DRAM including a multiplicity of DRAM blocks, said test system comprising:

means for generating a test data pattern;

means for writing said test data pattern into each DRAM block sequentially from a first DRAM block to a last DRAM block of said multiplicity of DRAM blocks, said means for writing including means for completing writing of a previous DRAM block before the start of writing of a subsequent DRAM block of said multiplicity of DRAM blocks;

means for reading out a resultant data pattern from each said DRAM block sequentially from a first DRAM block to a last DRAM block of said multiplicity of said DRAM blocks after a predetermined period of time has elapsed from said writing of said test data into each said DRAM block, said means for reading including means for completing reading of any previous DRAM block of said multiplicity of DRAM blocks before starting reading of a subsequent DRAM block of said multiplicity of DRAM blocks;

means for storing scan out data for each said DRAM block, said scan out data comprising said resultant data pattern or information based on said resultant data pattern of each said DRAM block, said means for storing including means for completing storing of scan out data for a previous DRAM block of said multiplicity of DRAM blocks before starting storing of scan out data for a subsequent DRAM block of said multiplicity of said DRAM blocks.

9. The test system of claim 8 further including:

means for comparing said resultant data pattern with said test data pattern; and means for creating redundancy allocation information based on the comparison between said resultant data pattern and said test data pattern.

10. The test system of claim 9, further including means for writing back fuse delete information based on said redundancy allocation information into said multiplicity of store registers.

11. The test system of claim 9, wherein said scan out data comprises said redundancy allocation information.

12. The test system of claim 8, wherein said means for storing scan out data comprises a multiplicity of store registers.

13. The test system of claim 12, wherein there is a respective store register of said store registers for each DRAM blocks of said multiplicity of DRAM blocks.

14. The test system of claim 12, further including means for scanning out said scan out data from said multiplicity of store registers sequentially, said means for scanning out said scan out data including means for completing scanning out of any scan out data of a previous store register of said multiplicity of store registers before starting scanning out of scan out data of a subsequent store register of said multiplicity of store registers.

15. The test system of claim 12, wherein a number of said store registers of said multiplicity of store registers is equal to the number of said DRAM blocks of said multiplicity of DRAM blocks.

16. The test system of claim 12, wherein said means for means for storing said scan out data for each said DRAM block on said multiplicity of store registers includes a redundancy allocation register coupled to a redundancy allocation store device, said redundancy allocation store device including an interface shift register coupled to each said store register of said multiplicity of store registers.

17. The test system of claim 16, further including means for writing the contents of said interface shift register into a previous store register of said multiplicity of store registers as the contents of a subsequent store register of said multiplicity of store registers are simultaneously written into said interface shift register.

18. The test system of claim 13, further including means for simultaneously swapping the state of latches within said redundancy allocation register with the state of latches within said interface shift register.

* * * * *

UNITED STATES PATENT AND TRADEMARK OFFICE
CERTIFICATE OF CORRECTION

| | |
|---|---|
| PATENT NO. | : 7,237,165 B2 |
| APPLICATION NO. | : 10/994496 |
| DATED | : June 26, 2007 |
| INVENTOR(S) | : Chadwick et al. |

Page 1 of 1

It is certified that error appears in the above-identified patent and that said Letters Patent is hereby corrected as shown below:

<u>On the Title Page</u>

Item (75) *Inventors*, insert -- Brian R. Kessler, Richmond, VT (US); --

Signed and Sealed this

Sixteenth Day of September, 2008

JON W. DUDAS
*Director of the United States Patent and Trademark Office*